(12) United States Patent
Bean, Jr. et al.

(10) Patent No.: US 8,934,242 B2
(45) Date of Patent: *Jan. 13, 2015

(54) HOT AISLE CONTAINMENT COOLING SYSTEM AND METHOD

(75) Inventors: John H. Bean, Jr., Wentzville, MO (US); John Christopher Niemann, St. Charles, MO (US)

(73) Assignee: Schneider Electric IT Corporation, West Kingston, RI (US)

( * ) Notice: Subject to any disclaimer, the term of this patent is extended or adjusted under 35 U.S.C. 154(b) by 152 days.

This patent is subject to a terminal disclaimer.

(21) Appl. No.: 13/476,232

(22) Filed: May 21, 2012

(65) Prior Publication Data

US 2012/0229972 A1 Sep. 13, 2012

Related U.S. Application Data

(63) Continuation of application No. 12/361,087, filed on Jan. 28, 2009, now Pat. No. 8,184,435.

(51) Int. Cl.
*H05K 7/20* (2006.01)
*H05K 5/00* (2006.01)
*G06F 1/20* (2006.01)

(52) U.S. Cl.
CPC ................................ *H05K 7/20745* (2013.01)
USPC .................. 361/696; 361/679.48; 361/679.53; 361/679.54; 361/695; 361/698; 361/699; 361/701; 165/104.33; 454/184

(58) Field of Classification Search
USPC ............. 361/679.46–679.49, 679.53–679.54, 361/690, 694–696, 698, 699, 701, 704, 361/716; 165/80.3–80.4, 104.33, 185; 454/184

See application file for complete search history.

(56) References Cited

U.S. PATENT DOCUMENTS

| 1,680,092 | A | 8/1928 | Dixson |
| 2,060,582 | A | 11/1936 | Leffert |
| 3,545,224 | A | 12/1970 | Nicoski et al. |
| 3,791,089 | A | 2/1974 | Alderman |
| 4,063,431 | A | 12/1977 | Dankowski |
| 4,083,245 | A | 4/1978 | Osborn |
| 4,138,857 | A | 2/1979 | Dankowski |
| 5,028,087 | A | 7/1991 | Ells |

(Continued)

FOREIGN PATENT DOCUMENTS

| CN | 1521591 A | 8/2004 |
| CN | 2763404 Y | 3/2006 |

(Continued)

OTHER PUBLICATIONS

"Inter-Rack Flow Seperator to Prevent Computer Rack Hot Exhaust Air Entry into Cold Region at Rack Inlet of Computer Data Center Facilities" IP.Com Journal, IP.Com Inc., West Henrietta, NY, US, Jun. 20, 2006, XP013114636 ISSN: 1533-0001.

(Continued)

*Primary Examiner* — Robert J Hoffberg
(74) *Attorney, Agent, or Firm* — Lando & Anastasi, LLP

(57) ABSTRACT

An air containment cooling system for containing and cooling air between two rows of equipment racks includes a canopy assembly configured to enclose a hot aisle defined by the two rows of equipment racks, and a cooling system embedded within the canopy assembly. The cooling system is configured to cool air disposed within the hot aisle. Other embodiments and methods for cooling are further disclosed.

18 Claims, 6 Drawing Sheets

(56) References Cited

U.S. PATENT DOCUMENTS

| | | | |
|---|---|---|---|
| 5,259,206 | A | 11/1993 | Dankowski |
| 5,279,360 | A | 1/1994 | Hughes et al. |
| 5,341,870 | A | 8/1994 | Hughes et al. |
| 5,533,259 | A | 7/1996 | Hughes et al. |
| 5,879,232 | A | 3/1999 | Luter, II et al. |
| 5,924,300 | A | 7/1999 | Fromm et al. |
| 6,034,873 | A | 3/2000 | Ståhl et al. |
| 6,199,337 | B1 | 3/2001 | Colson et al. |
| 6,315,525 | B1 | 11/2001 | Webb |
| 6,343,011 | B1 | 1/2002 | Yu |
| 6,668,565 | B1 | 12/2003 | Johnson et al. |
| 6,672,955 | B2 | 1/2004 | Charron |
| 6,732,789 | B2 | 5/2004 | Jang |
| 6,859,366 | B2 | 2/2005 | Fink |
| 6,880,349 | B2 | 4/2005 | Johnson et al. |
| 6,967,283 | B2 | 11/2005 | Rasmussen et al. |
| 6,980,433 | B2 | 12/2005 | Fink |
| 7,046,514 | B2 | 5/2006 | Fink et al. |
| 7,140,193 | B2 | 11/2006 | Johnson et al. |
| 7,145,772 | B2 | 12/2006 | Fink |
| 7,165,412 | B1 | 1/2007 | Bean, Jr. |
| 7,173,820 | B2 | 2/2007 | Fink et al. |
| 7,259,963 | B2 | 8/2007 | Germagian et al. |
| 7,278,273 | B1 | 10/2007 | Whitted et al. |
| 7,293,666 | B2 | 11/2007 | Mattlin et al. |
| 7,297,022 | B2 | 11/2007 | Pearce |
| 7,325,410 | B1 | 2/2008 | Bean, Jr. |
| 7,372,695 | B2 | 5/2008 | Coglitore et al. |
| 7,403,391 | B2 | 7/2008 | Germagian et al. |
| 7,430,118 | B1 | 9/2008 | Noteboom et al. |
| 7,508,663 | B2 | 3/2009 | Coglitore |
| 7,508,666 | B1 | 3/2009 | Henneberg et al. |
| 7,511,960 | B2 | 3/2009 | Hillis et al. |
| 7,551,971 | B2 | 6/2009 | Hillis |
| 7,611,327 | B2 | 11/2009 | Holston et al. |
| 7,643,285 | B2 | 1/2010 | Nishiyama et al. |
| 7,646,590 | B1 | 1/2010 | Corhodzic et al. |
| 7,672,128 | B2 * | 3/2010 | Noteboom et al. ............ 361/696 |
| 7,688,578 | B2 * | 3/2010 | Mann et al. ............... 361/679.46 |
| 7,724,518 | B1 | 5/2010 | Carlson et al. |
| 7,800,900 | B1 | 9/2010 | Noteboom et al. |
| 7,856,838 | B2 | 12/2010 | Hillis et al. |
| 7,916,470 | B2 | 3/2011 | Mills et al. |
| 7,944,692 | B2 | 5/2011 | Grantham et al. |
| 7,957,142 | B2 | 6/2011 | Noteboom et al. |
| 7,990,710 | B2 | 8/2011 | Hellriegel et al. |
| 8,031,468 | B2 * | 10/2011 | Bean et al. ...................... 361/696 |
| 8,174,829 | B1 | 5/2012 | Rotheroe |
| 8,184,435 | B2 | 5/2012 | Bean, Jr. et al. |
| 8,251,785 | B2 | 8/2012 | Schmitt et al. |
| 8,305,757 | B2 | 11/2012 | Keisling et al. |
| 8,360,833 | B2 | 1/2013 | Grantham |
| 8,395,891 | B2 * | 3/2013 | Noteboom et al. ....... 361/679.48 |
| 8,405,982 | B2 * | 3/2013 | Grantham et al. ............. 361/688 |
| 8,611,087 | B2 * | 12/2013 | Sato et al. ...................... 361/696 |
| 8,628,154 | B2 * | 1/2014 | Caveney et al. ............... 312/198 |
| 8,628,158 | B2 * | 1/2014 | Caveney ..................... 312/265.3 |
| 8,755,182 | B2 * | 6/2014 | Noteboom et al. ............ 361/688 |
| 2003/0050003 | A1 | 3/2003 | Charron |
| 2004/0184232 | A1 | 9/2004 | Fink |
| 2005/0011637 | A1 | 1/2005 | Takano |
| 2005/0209740 | A1 | 9/2005 | Vann |
| 2005/0280986 | A1 | 12/2005 | Coglitore et al. |
| 2006/0108105 | A1 | 5/2006 | Huang et al. |
| 2006/0260338 | A1 | 11/2006 | VanGilder et al. |
| 2006/0283111 | A1 | 12/2006 | Ayers et al. |
| 2007/0084589 | A1 | 4/2007 | Nishino et al. |
| 2007/0146994 | A1 | 6/2007 | Germagian et al. |
| 2007/0167125 | A1 | 7/2007 | Rasmussen et al. |
| 2007/0262606 | A1 | 11/2007 | Schnoblen et al. |
| 2008/0043426 | A1 | 2/2008 | Nishiyama et al. |
| 2008/0055850 | A1 | 3/2008 | Carlson et al. |
| 2008/0060372 | A1 | 3/2008 | Hillis et al. |
| 2008/0123288 | A1 | 5/2008 | Hillis |
| 2008/0141525 | A1 | 6/2008 | Breiding et al. |
| 2008/0160902 | A1 | 7/2008 | Desler |
| 2008/0185446 | A1 | 8/2008 | Tozer |
| 2008/0291626 | A1 | 11/2008 | Nelson et al. |
| 2009/0014397 | A1 | 1/2009 | Moss et al. |
| 2009/0025418 | A1 | 1/2009 | De La Cruz et al. |
| 2009/0046427 | A1 | 2/2009 | Noteboom et al. |
| 2009/0046429 | A1 | 2/2009 | Werner et al. |
| 2009/0080173 | A1 | 3/2009 | Porter et al. |
| 2009/0086428 | A1 | 4/2009 | Campbell et al. |
| 2009/0168345 | A1 | 7/2009 | Martini |
| 2009/0241578 | A1 | 10/2009 | Carlson et al. |
| 2009/0251860 | A1 | 10/2009 | Belady et al. |
| 2009/0255653 | A1 | 10/2009 | Mills et al. |
| 2009/0319650 | A1 | 12/2009 | Collins et al. |
| 2010/0061057 | A1 | 3/2010 | Dersch et al. |
| 2010/0111698 | A1 | 5/2010 | Wiedeman et al. |
| 2010/0144265 | A1 | 6/2010 | Bednarcik et al. |
| 2010/0188816 | A1 | 7/2010 | Bean, Jr. et al. |
| 2010/0190430 | A1 | 7/2010 | Rodriguez et al. |
| 2010/0230058 | A1 | 9/2010 | Mahoney |
| 2010/0263830 | A1 | 10/2010 | Noteboom et al. |
| 2010/0329885 | A1 | 12/2010 | Criner et al. |
| 2011/0108207 | A1 | 5/2011 | Mainers et al. |
| 2012/0012283 | A1 | 1/2012 | Bean, Jr. et al. |
| 2012/0300391 | A1 * | 11/2012 | Keisling et al. ........... 361/679.46 |
| 2013/0300266 | A1 * | 11/2013 | Ramey et al. .................. 312/111 |

FOREIGN PATENT DOCUMENTS

| | | |
|---|---|---|
| CN | 1880779 A | 12/2006 |
| CN | 101438637 A | 5/2009 |
| DE | 2004 14 274 U1 | 11/2000 |
| DE | 20 2004 003309 U1 | 8/2004 |
| DE | 202008010718 U1 | 2/2009 |
| EP | 0033182 A2 | 8/1981 |
| EP | 1 069 381 A1 | 1/2001 |
| EP | 1448040 A2 | 8/2004 |
| FR | 2949641 A1 | 3/2011 |
| JP | 2003-166729 A | 6/2003 |
| JP | 2005260148 A | 9/2005 |
| JP | 2007316989 A | 12/2007 |
| JP | 2009097774 A | 5/2009 |
| JP | 2010122747 A | 6/2010 |
| SE | 456449 B | 10/1988 |
| WO | 9963797 A1 | 12/1999 |
| WO | 2007090804 A2 | 8/2007 |

OTHER PUBLICATIONS

American Power Conversion Corporation Brochure, "Hot Aisle Containment System (HACS)," 2008, pp. 1-68.

APC's InfraStruXure(R) Hot-Aisle Containment Systems a Key to Sun's New Energy Efficient Data Center, Press release of American Power Conversion Corporation, West Kingston, R.I., Oct. 16, 200T.

International Search Report for PCT/US2009/053759 mailed Apr. 9, 2010.

International Search Report for PCT/US2009/068506 mailed Apr. 8, 2010.

International Search Report for PCT/US2010/035092 dated Aug. 31, 2010.

International Search Report for PCT/US2010/035212 mailed Feb. 8, 2011.

International Search Report for PCT/US2010/035418 mailed Aug. 17, 2010.

Invitation to Pay Additional Fees and Partial International Search Report for PCT/US2009/053759 mailed Nov. 16, 2009.

Invitation to Pay Additional Fees and Partial International Search Report for PCT/US2010/035212 mailed Oct. 5, 2010.

Rotheroe et al., "Hot Aisle Based Heat Removal Unit", RD545030, Hewlett-Packard Co., Sep. 2009.

Stahl et al., "Designing an Alternative to Conventional Room Cooling", Interlec 2001, Oct. 2001, pp. 109-115.

Modern Plastics, accessed Aug. 22, 2014 from http://www.modernplastics.com/-c-103.html.

* cited by examiner

HOT AISLE CONTAINMENT COOLING SYSTEM AND METHOD

CROSS-REFERENCE TO RELATED APPLICATIONS

This application is a continuation of U.S. application Ser. No. 12/361,087 filed Jan. 28, 2009, which is hereby incorporated herein by reference.

BACKGROUND OF THE DISCLOSURE

1. Field of the Disclosure

The present disclosure relates to racks and enclosures, and more particularly to equipment used to cool racks and enclosures of the type used to house data processing, networking and telecommunications equipment.

2. Discussion of Related Art

Equipment enclosures or racks for housing electronic equipment, such as data processing, networking and telecommunications equipment have been used for many years. Such racks are often used to contain and to arrange the equipment in large equipment rooms and data centers. Over the years, a number of different standards have been developed to enable equipment manufacturers to design rack mountable equipment that can be mounted in standard racks manufactured by different manufacturers. A standard rack typically includes front mounting rails to which multiple units of electronic equipment, such as servers and CPUs, are mounted and stacked vertically within the rack. An exemplary industry-standard rack is approximately six to six-and-a-half feet high, by about twenty-four inches wide, and about forty inches deep. Such a rack is commonly referred to as a "nineteen inch" rack, as defined by the Electronics Industries Association's EIA-310-D standard.

Management systems have been developed to manage the power distribution and cooling systems of data centers containing racks. One such management system is known as the InfraStruXure™ ("ISX") manager offered by American Power Conversion Corporation of West Kingston, R.I., the assignee of the present disclosure, which is particularly designed to control the operation of large data centers.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

Previously, in certain configurations, data centers have been cooled by a data center's cooling system with computer room air conditioner ("CRAC") units that are typically hard piped, immobile units positioned around the periphery of the data center room. These CRAC units intake air from the fronts of the units and output cooler air upwardly toward the ceiling of the data center room. In other embodiments, the CRAC units intake air from near the ceiling of the data center room and discharge cooler air under a raised floor for delivery to the fronts of the equipment racks. In general, such CRAC units intake room temperature air (at about 72° F.) and discharge cold air (at about 55° F.), which is blown into the data center room and mixed with the room temperature air at or near the equipment racks.

In other embodiments, the CRAC units may be modular and scalable so that the units may be placed anywhere within the data center depending on the cooling requirements within the data center. Such cooling units are described in pending U.S. patent application Ser. No. 11/335,874, entitled COOLING SYSTEM AND METHOD, filed on Jan. 19, 2006.

The rack-mounted equipment typically cools itself by drawing air along a front side or air inlet side of a rack, drawing the air through its components, and subsequently exhausting the air from a rear or vent side of the rack. In a certain embodiment, air is drawn through the equipment racks from a "cold" aisle, which is typically located at the fronts of the equipment racks. The heated air is exhausted from the equipment racks to a "hot" or "warm" aisle, which is typically located at the backs of the equipment racks. A disadvantage of the CRAC-type air conditioning system is that cool air is mixed with the room temperature air, which is inefficient. Ideally, to make the system as efficient as possible, and to utilize as little energy and floor space as possible, the highest possible temperature air should be drawn into the CRAC units and the outlet air generated by the CRAC should be a few degrees below room temperature. In addition, airflow requirements can vary considerably as a result of different numbers and types of rack-mounted components and different configurations of racks and enclosures.

In order to control the flow of air throughout the data center, and to optimize the air flow as described above, it may be desirable to contain and cool the air within the hot and cold aisles, and in particular, the hot aisle. Examples of such a hot aisle air containment system may be found in U.S. Pat. Nos. 6,859,366 and 7,046,514. Other examples of hot aisle containment systems are provided by American Power Conversion Corporation of West Kingston, R.I., the assignee of the present disclosure, under model nos. ACDC1014, ACDC1015, ACDC1018 and ACDC1019.

Another issue facing data room center designers is management of power and cables within the data center. Given the number of enclosures and equipment housed by the enclosures within the data center, managing the power requirements of the equipment and the organization of the cables has traditionally been difficult.

SUMMARY OF THE DISCLOSURE

One aspect of the disclosure is directed to an air containment cooling system for containing and cooling air between two rows of equipment racks. In one embodiment, the air containment cooling system comprises a canopy assembly configured to enclose a hot aisle defined by the two rows of equipment racks, and a cooling system embedded within the canopy assembly. The cooling system is configured to cool air disposed within the hot aisle.

Embodiments of the air containment cooling system may include providing the canopy assembly with a frame structure having a plurality of vertical and horizontal support members, and at least one cooling panel configured to be supported by the frame structure. In certain embodiments, the at least one cooling panel encloses and contains air within the hot aisle, the cooling system includes a heat exchanger disposed within the at least one cooling panel, the plurality of vertical and horizontal support members include pipes configured to deliver coolant to the heat exchanger, and the heat exchanger includes a coil. The air containment cooling system further includes a fan to move air to the coil in which the fan is supported by the frame structure. The air containment cooling system further comprises filler panels configured to be disposed between adjacent equipment racks, one or more cable troughs, and/or a bus that extends along the hot aisle. In one or more embodiments, the bus is one of a power distribution bus, a cable management bus, and a cooling bus, and the bus defines a side of the canopy assembly.

Another aspect of the disclosure is directed to a method of cooling a hot aisle of equipment racks of a data center. In one embodiment, the method comprises: containing air within the hot aisle of the data center by providing a canopy assembly above the hot aisle and between rows of equipment racks; disposing cooling equipment within the canopy assembly; and cooling air contained within the hot aisle by the cooling equipment.

Embodiments of the method further include providing filler panels between adjacent equipment racks to further contain air within the hot aisle, moving air within the hot aisle toward the cooling equipment within the canopy assembly, and/or providing IT equipment, power distribution and cable management capabilities.

A further aspect of the disclosure is directed to a kit for cooling air within a hot aisle of a data center of the type having rows of equipment racks. In certain embodiments, the kit comprises: a canopy assembly configured to enclose a hot aisle defined by the two rows of equipment racks; and a cooling system embedded within the canopy assembly. The cooling system is configured to cool air disposed within the hot aisle.

Embodiments of the kit may include providing the canopy assembly with a frame structure having a plurality of vertical and horizontal support members, and at least one cooling panel configured to be supported by the frame structure. The plurality of vertical and horizontal support members include pipes configured to deliver coolant to the coil. The at least one cooling panel encloses and contains air within the hot aisle. The cooling system includes a heat exchanger disposed within the at least one cooling panel in which the heat exchanger includes a coil. The kit may further include one or more of the following: a fan to move air to the coil in which the fan is supported by the frame structure; filler panels; a cable trough; and a bus that extends along the hot aisle. The bus is one of a power distribution bus, a cable management bus, and a cooling bus, and defines a side of the canopy assembly.

Yet another aspect of the disclosure is directed to an air containment cooling system for containing and cooling air between two rows of equipment racks. In a certain embodiment, the air containment cooling system comprises a canopy assembly configured to enclose a hot aisle defined by the two rows of equipment racks, and means embedded within the canopy assembly for cooling air disposed within the hot aisle.

Embodiments of the air containment cooling system may include providing the canopy assembly with a frame structure having a plurality of vertical and horizontal support members, and at least one cooling panel configured to be supported by the frame structure. In certain embodiments, the cooling means includes a cooling system having at least one cooling panel that encloses and contains air within the hot aisle. The cooling system includes a heat exchanger disposed within the at least one cooling panel. The plurality of vertical and horizontal support members include pipes configured to deliver coolant to the heat exchanger. The heat exchanger includes a coil. The air containment cooling system further includes a fan to move air to the coil in which the fan is supported by the frame structure. The air containment cooling system further comprises filler panels configured to be disposed between adjacent equipment racks, one or more cable troughs, and/or a bus that extends along the hot aisle. In one or more embodiments, the bus is one of a power distribution bus, a cable management bus, and a cooling bus, and the bus defines a side of the canopy assembly.

BRIEF DESCRIPTION OF THE DRAWINGS

In the drawings, each identical or nearly identical component that is illustrated in various figures is represented by a like numeral. For purposes of clarity, not every component may be labeled in every drawing. For a better understanding of the present disclosure, reference is made to the figures which are incorporated herein by reference and in which.

DETAILED DESCRIPTION OF THE PREFERRED EMBODIMENTS

Figure 1:
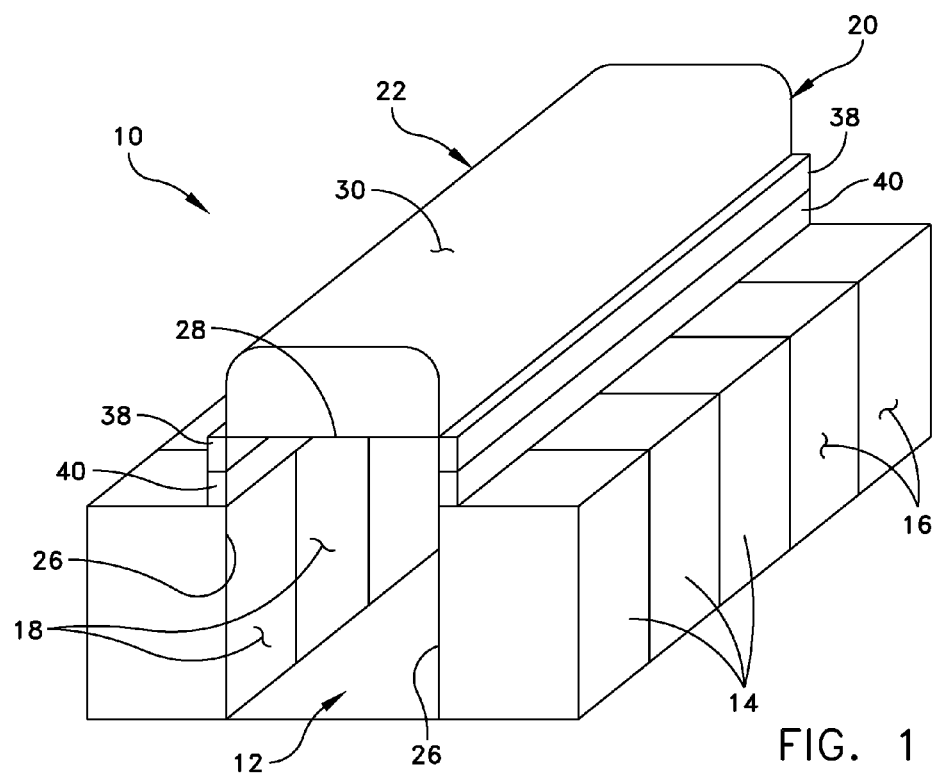
FIG. 1 is a schematic perspective view of a portion of a data center showing a hot aisle defined by two rows of equipment racks and an air containment cooling system of an embodiment of the disclosure for containing and cooling air within the hot aisle.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The disclosure is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

A typical data center may be designed to house a number of equipment racks. In one embodiment, each equipment rack may be constructed in accordance with the teachings disclosed in U.S. Pat. No. 7,293,666, entitled EQUIPMENT ENCLOSURE KIT AND ASSEMBLY METHOD, which is owned by the assignee of the present disclosure and is incorporated herein by reference. Other examples of equipment racks are sold by American Power Conversion Corporation under the brand name NetShelter™. Further, cabling between the equipment racks may be implemented using cable distribution troughs contained on the roofs of the racks as disclosed in U.S. Pat. No. 6,967,283, which is also incorporated herein by reference and assigned to the assignee of the present disclosure. The principles of the present disclosure may be adapted to smaller data centers, equipment rooms and computer rooms. The data center described herein is provided by way of example only.

Each equipment rack may be configured to include a frame or housing adapted to support electronic components, such as data processing, networking and telecommunications equipment. The housing includes a front, a back, opposite sides, a bottom and a top. The front of each equipment rack may include a front door so as to enable access into the interior of the equipment rack. A lock may be provided to prevent access into the interior of the equipment rack and the equipment housed by the rack. The sides of the equipment rack may include at least one panel to enclose the interior region of the rack. The back of the equipment rack may also include at least one panel or a back door to provide access to the interior of the equipment rack from the back of the rack. In certain embodiments, the side and back panels, as well as the front door and the rear door, may be fabricated from perforated sheet metal, for example, to allow air to flow into and out of the interior region of the equipment rack. In other embodiments, the front door may include a removable panel.

The equipment racks are modular in construction and configured to be rolled into and out of position, e.g., within a row of the data center. Casters may be secured to the bottom of each equipment rack to enable the rack to roll along the floor of the data center. Once positioned, leveling feet may be deployed to securely ground the equipment rack in place within the row.

Once in position, electronic equipment may be positioned in the interior region of the equipment rack. For example, the equipment may be placed on shelving secured within the interior region of the equipment rack. Cables providing electrical and data communication may be provided through the top of the equipment rack either through a cover (or "roof") at the top of the equipment rack having openings formed therein or through an open top of the equipment rack. In this embodiment, the cables may be strung along the roofs of the racks or be provided in the aforementioned cable distribution troughs. In another embodiment, the cables may be disposed within a raised floor and connected to the electronic equipment through the bottom of the equipment rack. With both configurations, power and communication lines are provided to and from the equipment racks.

As discussed above, data centers are typically configured with rows of equipment racks arranged such that cool air is drawn into the racks from a cool aisle and warm or hot air is exhausted from the racks into a hot aisle. In one embodiment, the equipment racks may be arranged in two rows with the fronts of the equipment racks in a near row being arranged in a forward direction and the backs of the equipment racks in a far row being arranged in a rearward direction. However, as stated above, in a typical data center, there may be multiple rows of equipment racks wherein the rows may be arranged with the fronts of the equipment racks facing one another to define the cold aisle and with the backs of the equipment racks facing one another to define the hot aisle. In other configurations, the hot or cold aisle may be disposed between a wall and a row of equipment racks. For example, a row of equipment racks may be spaced from a wall with the backs of the equipment racks facing the wall to define a hot aisle between the wall and the row of equipment racks.

In order to address the heat build-up and hot spots within the data center or equipment room, and to address climate control issues within the data center or room in general, one or more cooling systems may be provided. In one configuration, the cooling system may be provided as part of the data center infrastructure. In another configuration, the data center's cooling system may be supplemented with the traditional CRAC units described above. With yet another configuration, a modular cooling system may be further provided.

Such a modular system is described in pending U.S. patent application Ser. No. 11/335,874, entitled COOLING SYSTEM AND METHOD, filed on Jan. 19, 2006, which is owned by the assignee of the present disclosure and is incorporated herein by reference. The cooling system may include a plurality of cooling racks strategically disposed within the data center. In one embodiment, the arrangement may be such that there is a cooling rack for every two equipment racks provided in the data center. However, it should be understood that a person skilled in the art, and given the benefit of this disclosure, may provide more or less cooling racks within the data center depending on environmental conditions of the data center. Further in some embodiments, the concentration and locations of cooling racks may be adjusted based on the locations of the hottest racks in the data center, or based on information obtained and analyzed by a data center information management system and the type of equipment housed within the data center.

Details of the modular cooling system and its various components and configurations may be found in pending U.S. patent application Ser. No. 11/335,874. Also, the cooling system may embody other cooling configurations, such as those offered by American Power Conversion Corporation of West Kingstown, R.I., the assignee of the present disclosure.

In one embodiment, a management system may be provided to monitor and display conditions of a cooling rack or of multiple cooling racks. The management system may operate independently to control the operation of the cooling rack, and may be configured to communicate with a higher level network manager or with a management system associated with the equipment storage racks. For example, in a particular embodiment, a controller may be provided to control the operation of the cooling racks. The controller may be a dedicated unit to the cooling system of the data center. In another embodiment, the controller may be provided as part of an integrated data center control and monitoring system. In yet another embodiment, each cooling rack may be independently operable by a controller provided in the cooling rack that is in communication with controllers of the other cooling racks. Notwithstanding the particular configuration, the controller is designed to control the independent operation of the cooling racks within the data center.

For example, the controller may be configured to identify the failure or inability of a particular cooling rack located within the data center to cool the air, and to increase the cooling capacity of a cooling rack or cooling racks located near the failed cooling rack. In another embodiment, one cooling rack may operate as the main or master unit and the other cooling racks operate as subservient units that operate under the control of the main unit. In this embodiment, the main cooling rack may be manipulated by the data center operator to control the entire cooling system. For example, the controller may be configured to receive information from the equipment racks so as to determine the amount of power being drawn by each equipment rack. With this knowledge, the controller may be configured to increase the cooling capacity of certain cooling racks within the cooling system based on the energy drawn by the equipment racks.

As with the equipment racks, the cooling racks may be modular in construction and configured to be rolled into and out of position, e.g., within a row of the data center between two equipment racks. Casters may be secured to the bottom of the housing of the cooling rack to enable the cooling rack to roll along the floor of the data center. Once positioned, leveling feet may be deployed to securely ground the cooling rack in place within the row. In another embodiment, the housing of the cooling rack may be formed with an eye-bolt to enable a crane or some other lifting apparatus to raise and place the cooling rack within the data center.

In one embodiment, the arrangement is such that the fronts of the equipment and cooling racks are adjacent the cold aisle and the backs of the racks are adjacent the hot aisle. The modular and movable nature of the cooling rack makes it particularly effective in cooling locations within the data center requiring climate control, e.g., adjacent a hot aisle. This configuration enables the cooling rack to be used as a building block for data center cooling and climate control, as the data center operator adds and removes cooling racks on an as needed basis. Thus, the cooling rack allows a far superior level of scalability than prior CRAC units. In addition, an operable cooling rack may be quickly and easily provided to replace a failed cooling rack.

The controller may be adapted to control the operation of the cooling system based on environmental parameters obtained by the controller. In one embodiment, the controller may embody only controller units provided in the cooling racks that communicate with one another over a controller area network (CAN) bus. In other embodiments, a master controller may be provided to control the operation of the controller units. Each cooling rack may be provided with a display assembly that is operably coupled to the controller. The display assembly is adapted to display the environmental conditions of the data room, such as, and not limited to, the temperature and the humidity of the data center at the cooling rack, the temperature of the air entering into and exiting out of the cooling rack, the temperature of coolant entering into and exiting out of the cooling rack, the flow rate of coolant entering the cooling rack, and the cooling capacity of the cooling rack. Suitable monitors and/or gauges may be provided to acquire such information. Alternatively, or in addition to the foregoing embodiment, the environmental conditions may be displayed on a unit provided with an integrated data center control and monitoring system.

In certain circumstances, it may be desirable to control the air flow within the hot and cold aisles, and in the hot aisles in particular. Typically, heat generated from electronic components housed within the equipment racks is exhausted out of the backs of the equipment racks into the hot aisles. It may be further desirable to contain the hot air for conditioning by a cooling unit, such as the modular cooling unit described above. It is known to enclose the hot aisle with a ceiling assembly that is designed for the particular equipment rack configuration. Such known ceiling assemblies are typically installed when installing the equipment racks in the data center and are manufactured by the manufacturers of the equipment racks.

Embodiments of an air containment cooling system of the disclosure may include an air containment cooling system for containing and cooling air between two rows of equipment racks. In one embodiment, the air containment cooling includes a canopy assembly configured to enclose a hot aisle defined by the two rows of equipment racks. The air containment cooling system further includes a cooling system embedded within the canopy assembly. In a certain embodiment, the cooling system is configured to cool air disposed within the hot aisle. A bus may be provided that extends horizontally along the hot aisle. Embodiments of the bus may include one of a power distribution bus, a cable management bus, and a cooling bus, with the bus defining a side of the canopy assembly.

In other embodiments, the canopy assembly may include a frame structure having a plurality of vertical and horizontal support members, and at least one cooling panel configured to be supported by the frame structure. The at least one cooling panel may be configured to enclose and contain air within the hot aisle.

Embodiments of the cooling system may include disposing a heat exchanger within the at least one cooling panel. To deliver coolant to the heat exchanger, pipes may be disposed within the plurality of vertical and horizontal support members. A fan, supported by the frame structure, may be provided to direct air toward the heat exchanger. In a certain embodiment, the heat exchanger includes a coil.

Filler panels may be provided and configured to be disposed between adjacent equipment racks. The filler panels are designed to contain air within the hot aisle. In addition a cable trough may be connected to the canopy assembly.

The air containment cooling system of embodiments disclosed herein may be configured to be a free-standing docking station for equipment racks that contain equipment, such as information technology equipment. The system is specifically configured to support all of the necessary data center needs, including equipment requirements, power needs, cable management needs and cooling requirements. In one embodiment, the system may be designed to support an average of 20 kW per equipment rack requirement.

The system may be designed to receive equipment racks that are docked within open slots along a hot aisle docking station formed by the system, thereby eliminating the need of determining whether the space provided is suitable for the needs of the particular equipment rack. As mentioned above, power distribution, cable management and air containment and cooling are integrated within the system. Thus, field installation of equipment racks within the data center is greatly simplified. The system of embodiments of the disclosure enables the provision of one integrated solution that has been heretofore addressed separately by addressing rack, cooling, power and cable management requirements individually.

Referring now to the drawings, and more particularly to FIG. 1, a portion of a data center 10 is schematically illustrated. In particular, a hot aisle 12 within the data center 10 is illustrated. As shown, and by way of example only, a plurality of equipment racks, each indicated at 14, are disposed within the data center 10 to define the hot aisle 12. Specifically, a first row of equipment racks 14 are positioned so that fronts 16 of the equipment racks face outwardly. Similarly, a second row of equipment racks 14 are positioned so that the fronts of the equipment racks face outwardly and backs 18 of the equipment racks face backs 18 of the first row of equipment racks. The arrangement is such that cool air is drawn through the fronts of the equipment racks to cool the electronic equipment housed within the equipment racks. Hot air is exhausted through the backs of the equipment racks into the hot aisle 12. As discussed above, the aisle 12 may sometimes be referred to herein as the "hot" or "warm" aisle. Further, although not shown, cooling racks may be interposed among the equipment racks 14 for cooling the hot aisle 12. However, for illustration purposes only, equipment racks 14 are shown throughout the drawings. Also, as will be developed in greater detail below, the equipment racks may be placed or docked after the installation of the air containment cooling system.

As discussed above, warm air is directed from the equipment racks towards the hot aisle 12. The warm air rises, thus creating a situation in which the ceiling of the data center 10 may become too warm. This situation may negatively affect the climate control and management within the data center 10. An air containment cooling system, generally indicated at 20, of embodiments of the present disclosure is designed to contain and control the flow of warm air within the data center 10 in general, while providing power distribution and cable management to the equipment racks docked within the air containment cooling system.

Figure 2:
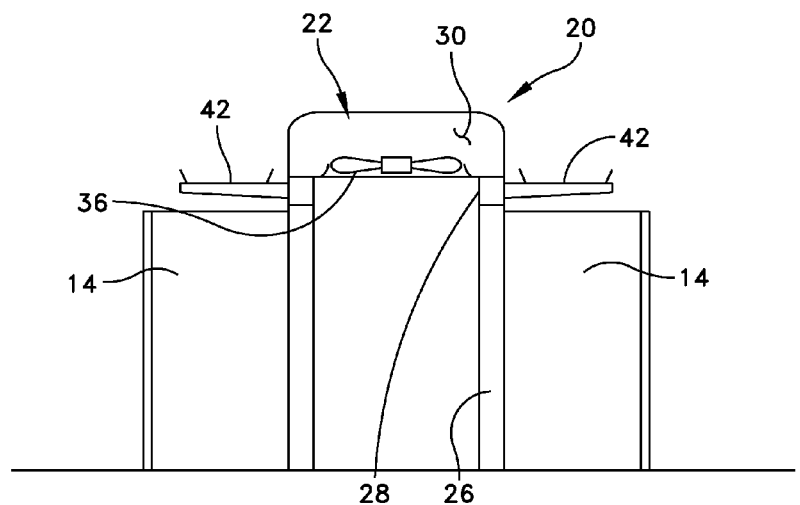
FIG. 2 is a schematic end view of the portion of the data center shown in FIG. 1.
Figure 3:
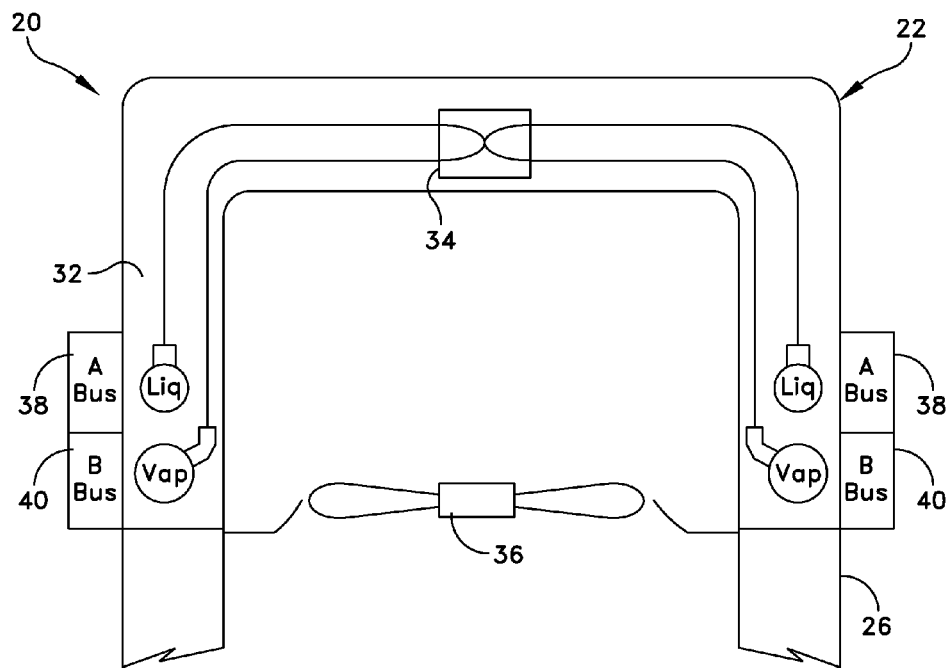
FIG. 3 is a schematic cross-sectional view of air containment cooling system shown in FIGS. 1 and 2.

In the embodiment shown in FIG. 1, and with additional reference to FIGS. 2 and 3, the air containment cooling system 20 includes a canopy assembly generally indicated at 22, which is configured to enclose the hot aisle, and a cooling system, which is embedded within the canopy assembly. The canopy assembly 22 includes a frame structure having a plurality of vertical support members, each indicated at 26, and a plurality of horizontal support members, each indicated at 28. The number of vertical and horizontal support members 26, 28 depends on the length of the hot aisle 12. The frame structure is configured to define the docking stations that receive the equipment racks 14.

The canopy assembly 22 further includes a cooling panel 30 that encloses the top of the system and thus contains warm air within the hot aisle 12 defined by the equipment racks 14. The cooling system is disposed within the cooling panel 30, and includes a heat exchanger 32 to cool air contained within the canopy assembly 22. In one embodiment, the cooling panel 30 is supported by the heat exchanger 32 of the cooling system, which are illustrated in FIGS. 2 and 3. In a particular embodiment, the heat exchanger 32 includes cooling coils, and specifically micro channel coils. The configuration of the heat exchanger 32 will be described in greater detail below with reference to FIGS. 6-11. In another embodiment, the frame structure may be configured to support the cooling panel 30 and the heat exchanger 32.

In embodiments of the disclosure, the vertical and horizontal support members 26, 28 support pipes that are configured to deliver coolant from a source (e.g., a chiller) to the heat exchanger 32 and back to the source. As shown in FIG. 3, the pipes may be provided so that one pipe delivers liquid coolant to the heat exchanger and another pipe exhausts vaporized coolant from the heat exchanger. Also, the frame structure may be configured at 34 to provide a center support and crossover. The cooling system further includes a fan 36 supported by the frame structure to direct warm air contained within the hot aisle 12 to the canopy assembly 22 and the heat exchanger 32. Depending on the length of the system 20, more than one fan 36 may be provided.

Still referring to FIGS. 1-3, the air containment cooling system 20 further includes one or more busses that extend along the horizontal support members 28 along the length of the hot aisle 12. As shown, in one embodiment, each side of the canopy assembly 22 includes two busses—an A Bus 38 and a B Bus 40. Each bus 38, 40 provides power distribution to the enclosures 14, and the provision of two busses provide redundancy to the system. In certain embodiments, the busses 38, 40 may be separated from one another so that each bus is dedicated to performing a certain function. For example, a power distribution bus, a cable management bus and a cooling bus may be provided. As shown in FIGS. 1 and 3, the busses 38, 40 may be configured to define a side of the canopy assembly 22. In other embodiments, only one bus may be provided on each side of the canopy assembly 22. In a particular embodiment, the electrical bus(es) may have provisions for modular installation of branch circuit protective devices to feed individual electrical circuits into the various equipment racks from a common ac bus.

With reference to FIG. 2, the air containment cooling system 20 may further include one or two cable troughs, each indicated at 42, mounted on one of the busses or to the frame structure of the canopy assembly 22. The cable troughs 42, in addition to the vertical and horizontal support members 26, 28, house and organize cables used to connect the equipment racks 14 to power and networking equipment. As discussed above, the cable troughs 42 may be of the type disclosed in U.S. Pat. No. 6,967,283.

Figure 4:
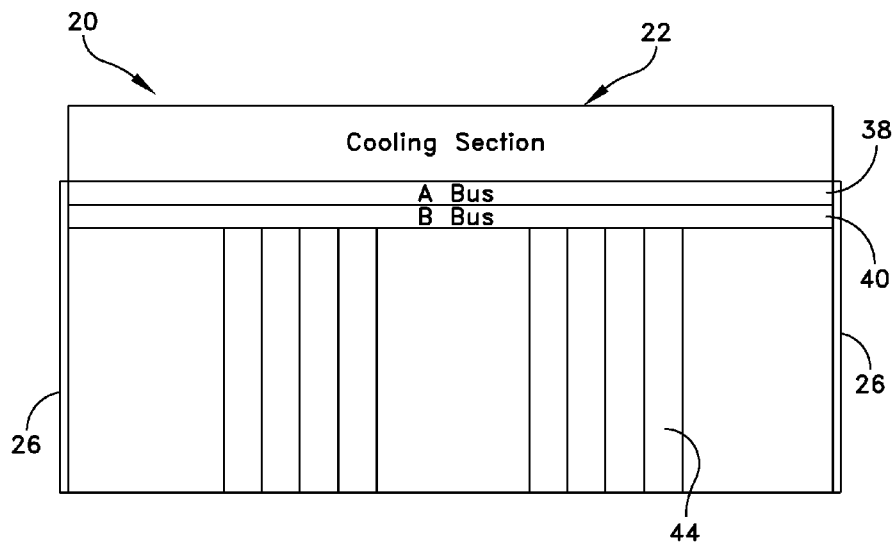
FIG. 4 is a schematic side elevational view of the portion of the data center shown in FIG. 1.

Referring to FIG. 4, there may be situations in which equipment racks 14 are removed from its respective station thereby leaving an opening between adjacent equipment racks. To block the open space created by the removed equipment rack, and to further contain air within the hot aisle 12, one or more filler panels may be provided. As shown, four filler panels, each indicated at 44, are provided for blocking the opening. However, it should be understood that any number of filler panels may be provided to block the opening. In one embodiment, the filler panels 44 are vertically oriented and configured to be disposed between adjacent racks having a gap between the adjacent racks. In certain embodiments, the gap is reserved for possible usage at a latter time as a space for an additional rack or racks.

Embodiments of the air containment cooling system may include providing the system in the form of a kit that is configured to include one or more of the following: a canopy assembly 22; a cooling system having one or more heat exchanger 32; one or more busses 38 and/or 40; cables (not shown) and communication wiring (not shown); and one or more filler panels 44. For example, the canopy assembly 22 may be configured to include the vertical and horizontal support members 26, 28 that may be erected on site to achieve the frame structure. The canopy assembly 22 may be scalable to achieve a desired length and/or width. Thus, depending on the length and/or width of the hot aisle, an appropriate number or vertical and horizontal support members 26, 28 may be included within the kit. The cooling system may be configured to include one or more heat exchangers 32, which, as described above, may embody coils and/or micro channel coils. The cooling system may be further provided with pipes or flexible tubing used to deliver coolant to the coils and/or micro channel coils comprising the heat exchanger 32. One or more fans 36 may be further provided with the cooling system.

In certain embodiments, panels and/or doors may be provided at each end of the hot aisle 12 to contain air within the hot aisle. Such panels and/or doors may be configured to secure to the vertical support members 26 to enclose the hot aisle 12. A door may be provided on each end of the hot aisle 12 to provide secure access to the hot aisle.

Methods of cooling a hot aisle of a data center may include containing air within the hot aisle of the data center by providing a canopy assembly above the hot aisle and between rows of equipment racks, disposing cooling equipment within the canopy assembly, and cooling air contained within the hot aisle by the cooling equipment. The method may further include providing filler panels between adjacent equipment racks to further contain air within the hot aisle and/or IT equipment, power distribution and cable management capabilities. The method may further include moving air within the hot aisle toward the cooling equipment within the canopy assembly. Movement of air may be achieved by employing one or more fans.

Figure 5:
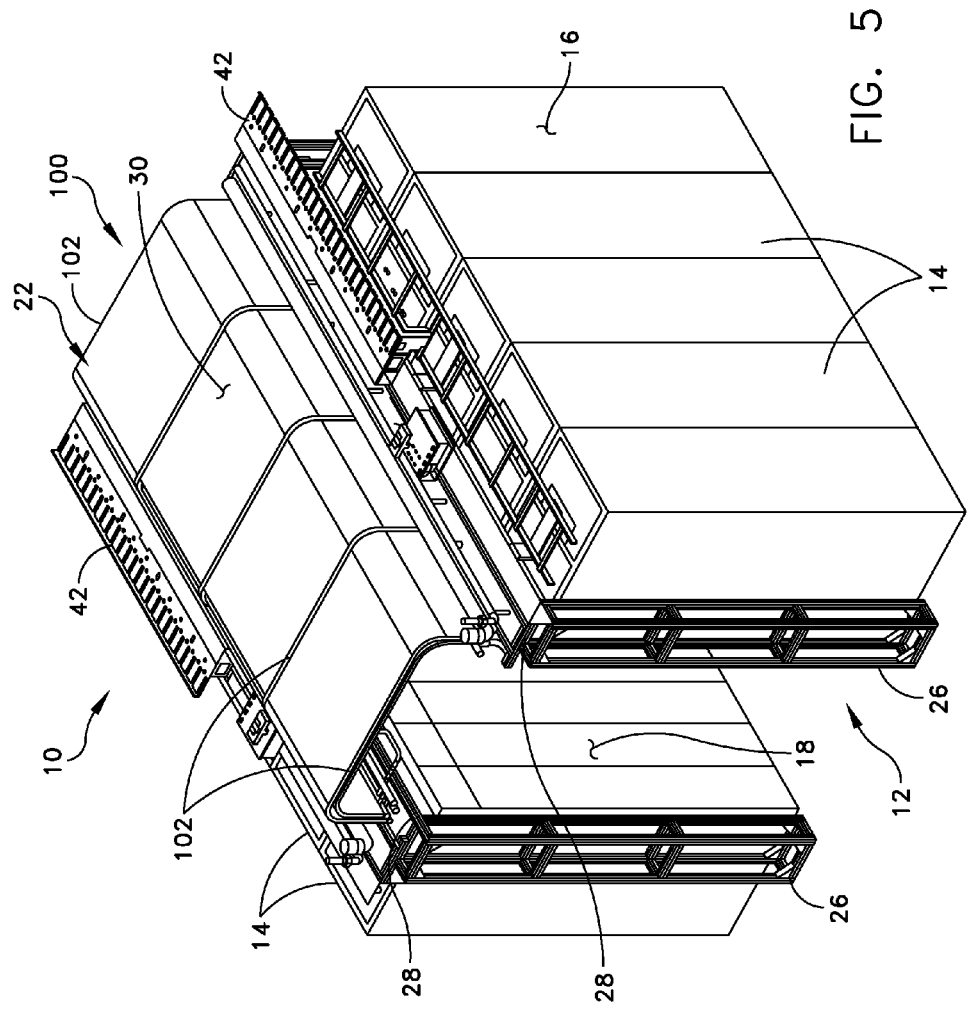
FIG. 5 is a perspective view of a portion of a data center showing a hot aisle defined by two rows of equipment racks and an air containment cooling system of another embodiment of the disclosure.

Turning now to FIG. 5, an exemplary air containment cooling system is generally designated at 100. As shown, system 100 is similar to system 20 with each identical or nearly identical component that is illustrated in FIGS. 1-4 being represented by a like numeral. As with system 20, the air containment cooling system 100 is configured to receive multiple equipment racks 14 so that the equipment racks define a hot aisle 12.

The air containment cooling system 100 includes a canopy assembly 22 including a frame structure having vertical support members 26 and horizontal support members 28. As shown, the canopy assembly 22 further includes canopy frame members, each indicated at 102, that span the width of the hot aisle 12 and are suitably supported by the horizontal support members 28. In one embodiment, the canopy frame members 102 include pipes configured to deliver and exhaust coolant from the heat exchanger (e.g., coils and/or micro channel coils) disposed within the canopy assembly 22 in the manner described below. As discussed below, larger supply and exhaust pipes may be provided to deliver cooled coolant to the heat exchanger and exhaust heated coolant back to the source of coolant.

Figure 6:
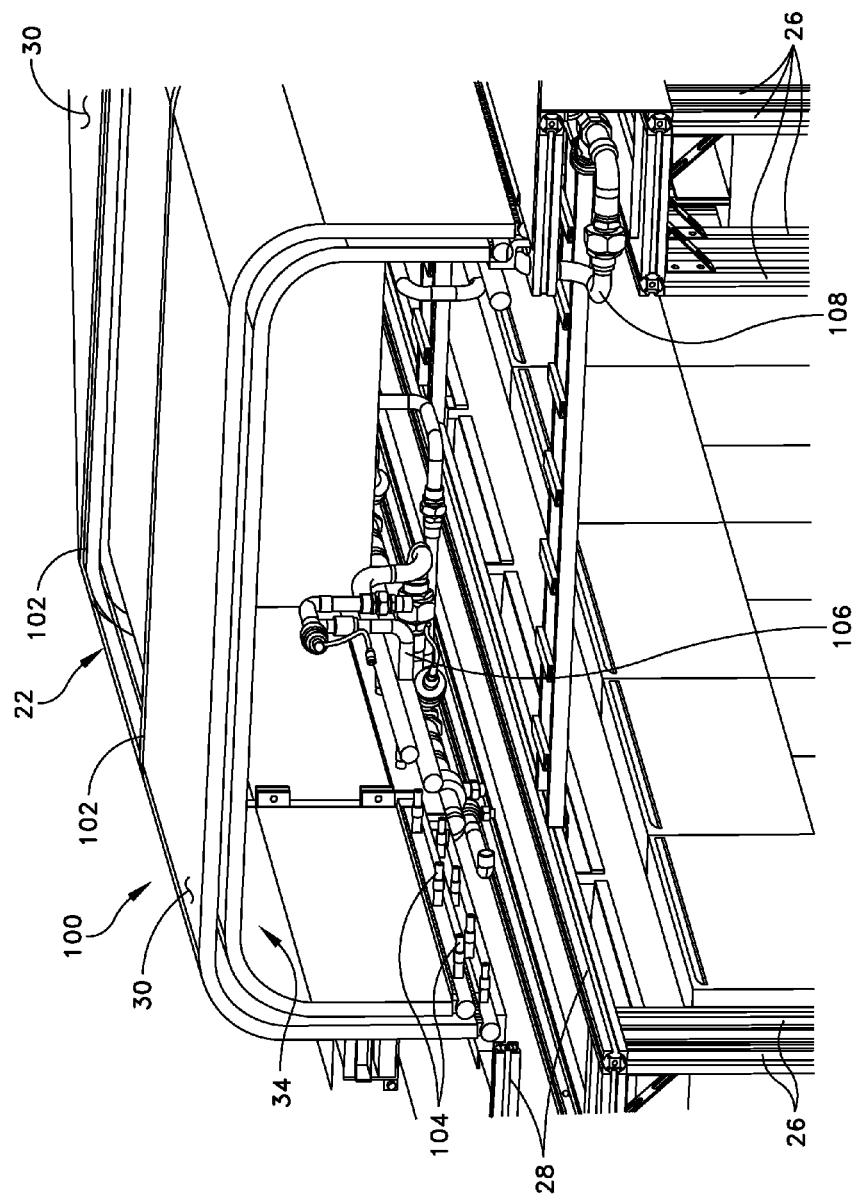
FIG. 6 is an enlarged perspective view of the portion of the data center shown in FIG. 5 with sections of a canopy assembly removed to illustrate components of cooling components.

As shown in FIG. 6, one or more cooling panels 30 are disposed between each canopy frame member 102 so as to enclose the hot aisle 12. Specifically, in one embodiment, two canopy panels, each indicated at 30, may be disposed one on top of the other to create cooling redundancy or provide additional cooling when addressing hot spots within the air containment zone. As shown, each canopy panel 30 includes multiple ports, each indicated at 104, which deliver and exhaust coolant into the canopy panel 30. For example, with the canopy panel 30 illustrated in FIG. 6, the ports 104 provided on the left-hand side of the canopy panel may be inlet ports. Thus, ports (not shown) provided on the right-hand side of the canopy panel 30 may be outlet ports. The arrangement is such that chilled coolant, taken from a suitable source, e.g., a chiller unit (not shown), may be delivered to the inlet ports 104 by piping 106. The chilled coolant runs through the canopy panel micro channel coils (discussed below) to absorb heat captured within the canopy assembly 22 covering the hot aisle 12. Heated coolant may be exhausted from the canopy panel 30 by piping 108 for delivery back to the source. Multiple ports 104 are provided to deliver and exhaust coolant from the canopy panel 30 thereby resulting in chilled coolant being evenly delivered to the canopy panel so that heat is uniformly treated within the canopy assembly 22.

Figure 7:
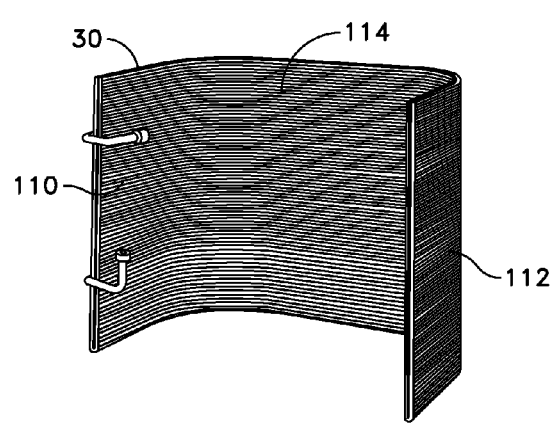
FIG. 7 is a perspective view of a section of the canopy assembly shown in FIG. 6.
Figure 8:
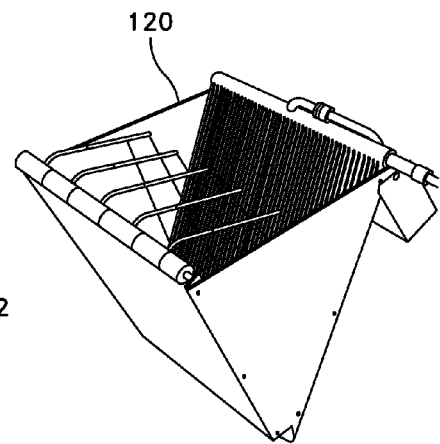
FIG. 8 is a perspective view of a section of the canopy assembly of another embodiment of the disclosure.

FIG. 7 illustrates a canopy panel 30 used in the canopy assembly 22 illustrated in FIG. 6. As shown, the canopy panel 30 is generally inverse U-shaped in construction, having two sides 110, 112 and a top 114. This construction increases the surface area of the canopy panel 30, thus, increasing the active cooling area of the overall canopy assembly 22. FIG. 8 illustrates a V-shaped canopy panel 120 of another embodiment of the disclosure.

Figure 9:
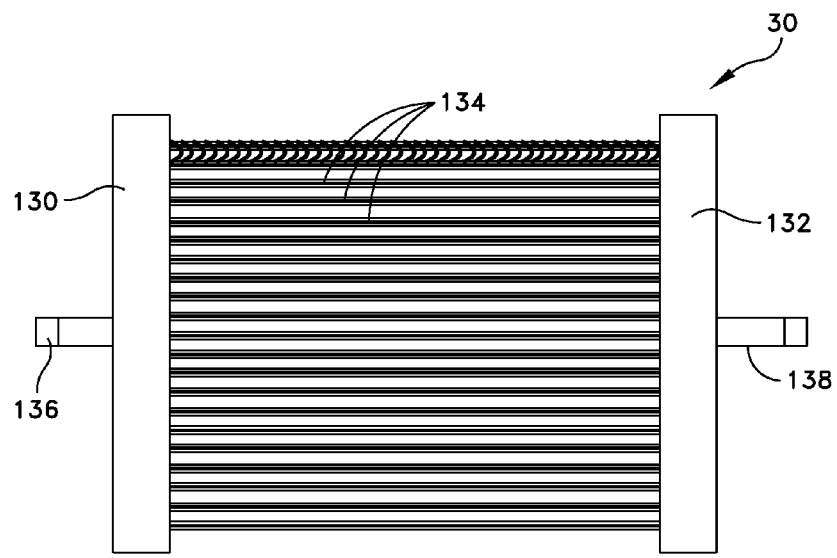
FIG. 9 is a view showing micro channel coils of the canopy assembly shown in FIGS. 6 and 7.
Figure 10:
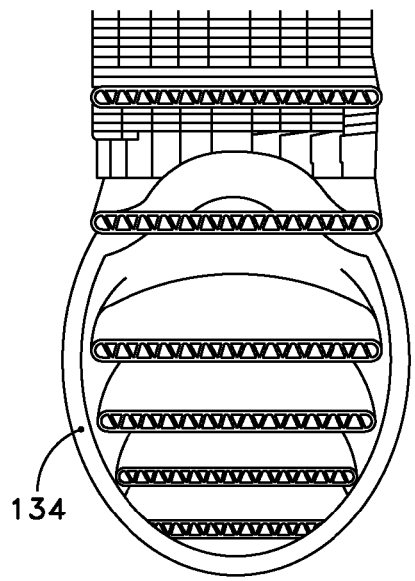
FIG. 10 is an enlarged cross-sectional view of one embodiment of the micro channel coils.
Figure 11:
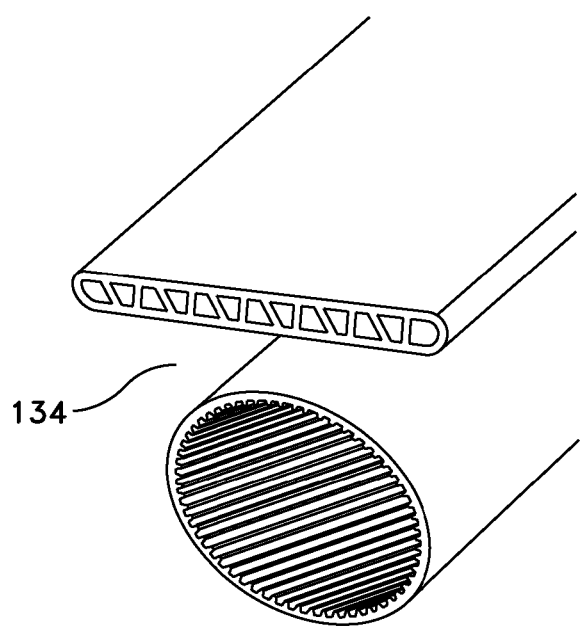
FIG. 11 is an enlarged cross-sectional view of another embodiment of the micro channel coils.

Referring to FIGS. 9-11, embodiments of the construction of micro channel coils are illustrated. As shown in FIG. 9, a portion of the canopy panel 30 includes a ladder-type structure having a pair of larger pipes 130, 132 spaced apart from one another with smaller micro channel coils, each indicated at 134, extending between the larger pipes. In one example, the arrangement is such that chilled coolant enters the left-hand pipe 130 by means of an inlet port 136. Once within the pipe 130, chilled coolant enters and flows through the micro channel coils 134. The exteriors of the micro channel coils 134 have fins that absorb heat from warm air flowing toward the canopy panel 30 thereby heating the coolant flowing through the micro channel coils. The warmed coolant is exhausted into the right-hand pipe 132 in which the coolant exits by means of an outlet port 138. FIG. 10 illustrates one embodiment of the micro channel coils 134 in which the coils include fins that are disposed in a desired direction. FIG. 11 illustrates another embodiment of the micro channel coils 134.

The air containment cooling system 100 further includes multiple cable troughs 42 that are connected to the horizontal support members 28 of the frame structure.

The vertical support members 26 may be manipulated to adjust the height of the air containment cooling system 100 so as to accommodate various data center configurations. It is contemplated that telescoping members may be provided.

Thus, it should be observed that the air containment cooling system of embodiments of the disclosure provides a domed cooling coil above the hot aisle that significantly increases the heat exchanger surface area to increase the cooling capacity of the system. In addition, the system provides an integrated solution in which cooling, air containment, power distribution, communication and cable management may be achieved within one system. In certain embodiments, multiple air containment cooling systems may be joined together so that they share common vertical support members. In addition, when joining multiple air containment cooling systems together to form a longer row, interior doors (not shown) may be provided between adjacent systems to better segregate airflow and capacity allocation within the hot aisle.

Having thus described at least one embodiment of the present disclosure, various alternations, modifications and improvements will readily occur to those skilled in the art. Such alterations, modifications and improvements are intended to be within the scope and spirit of the disclosure. Accordingly, the foregoing description is by way of example only and is not intended to be limiting. The disclosure's limit is defined only in the following claims and equivalents thereto.

What is claimed is:

1. An air containment cooling system for containing and cooling air between two rows of equipment racks, the air containment cooling system comprising:
    a canopy assembly configured to enclose a hot aisle defined by the two rows of equipment racks, the canopy assembly including a free-standing frame structure having a plurality of vertical and horizontal support members defining a docking station; and
    a cooling system, supported by the free-standing frame structure, the cooling system being configured to cool the air disposed within the hot aisle and including at least one cooling panel defined by a heat exchanger, the heat exchanger of the at least one cooling panel including a ladder-type structure having a pair of larger pipes spaced apart from one another with smaller micro channel coils extending between the larger pipes.

2. The air containment cooling system of claim 1, wherein the plurality of vertical and horizontal support members include pipes configured to deliver coolant to the heat exchanger.

3. The air containment cooling system of claim 1, further comprising a fan supported by the frame structure and configured to move the air to the micro channel coils.

4. The air containment cooling system of claim 1, further comprising vertical filler panels configured to be disposed between adjacent racks of the two rows of equipment racks having a gap between adjacent racks.

5. The air containment cooling system of claim 1, further comprising a cable trough positioned adjacent to one of the two sides of the heat exchanger of the at least one cooling panel.

6. The air containment cooling system of claim 1, further comprising a first bus that extends along one of the two sides of the heat exchanger of the at least one cooling panel.

7. The air containment cooling system of claim 6, further comprising a second bus that extends along another one of the two sides of the heat exchanger of the at least one cooling panel.

8. The air containment cooling system of claim 1, wherein the heat exchanger of the at least one cooling panel is substantially inverse U-shaped in construction and having two sides and a top to increase a surface area of the heat exchanger of the at least one cooling panel.

9. The air containment cooling system of claim 1, wherein the heat exchanger of the at least one cooling panel is substantially inverse V-shaped in construction and having two sides to increase a surface area of the heat exchanger of the at least one cooling panel.

10. The air containment cooling system of claim 1, wherein the micro channel coils include fins.

11. A method of cooling a hot aisle of equipment racks of a data center, the method comprising:
   containing air within the hot aisle of the data center by providing a canopy assembly above the hot aisle and between rows of the equipment racks, the canopy assembly including a free-standing frame structure having a plurality of vertical and horizontal support members defining a docking station;
   disposing a cooling system having at least one cooling panel defined by a heat exchanger in the canopy assembly, the heat exchanger of the at least one cooling panel being supported by the free-standing frame structure, the heat exchanger of the at least one cooling panel including a ladder-type structure having a pair of larger pipes spaced apart from one another with smaller micro channel coils extending between the larger pipes; and
   cooling the air contained within the hot aisle by the heat exchanger.

12. The method of claim 11, further comprising providing filler panels between adjacent equipment racks of each row of the two rows of equipment racks to further contain the air within the hot aisle.

13. The method of claim 11, further comprising moving the air within the hot aisle toward the heat exchanger disposed within the canopy assembly.

14. The method of claim 13, wherein the moving the air within the hot aisle toward the heat exchanger is achieved by at least one fan.

15. The method of claim 11, further comprising providing IT equipment, power distribution and cable management capabilities along one of the sides of the heat exchanger of the at least one cooling panel.

16. The method of claim 11, further comprising disposing a fan below a top of the heat exchanger of the at least one cooling panel.

17. The method of claim 11, wherein the heat exchanger of the at least one cooling panel is substantially inverse U-shaped in construction and has two sides and a top to increase a surface area of the heat exchanger of the at least one cooling panel.

18. The method of claim 11, wherein the heat exchanger of the at least one cooling panel is substantially inverse V-shaped in construction and has two sides to increase a surface area of the heat exchanger of the at least one cooling panel.

* * * * *